United States Patent [19]
Hawley et al.

[11] Patent Number: 5,962,910
[45] Date of Patent: Oct. 5, 1999

[54] METAL-TO-METAL VIA-TYPE ANTIFUSE

[75] Inventors: Frank W. Hawley, Campbell;
Abdelshafy A. Eltoukhy, San Jose;
John L. McCollum, Saratoga, all of Calif.

[73] Assignee: Actel Corporation, Sunnyvale, Calif.

[21] Appl. No.: 08/895,723

[22] Filed: Jul. 17, 1997

Related U.S. Application Data

[62] Division of application No. 08/538,962, Oct. 4, 1995, Pat. No. 5,741,720.

[51] Int. Cl.⁶ .................................................. H01L 29/00
[52] U.S. Cl. ........................... 257/530; 257/50; 257/209; 438/467; 438/600
[58] Field of Search .............................. 257/50, 209, 529, 257/530; 438/68, 600, 61, 131, 467

[56] References Cited

U.S. PATENT DOCUMENTS

| 3,634,929 | 1/1972 | Yoshida et al. ............................ 29/577 |
| 3,699,403 | 10/1972 | Boleky, III ................................ 317/235 |
| 3,877,049 | 4/1975 | Buckley ......................................... 357/2 |
| 4,146,902 | 3/1979 | Tanimoto et al. ........................... 357/6 |
| 4,210,996 | 7/1980 | Amemiya et al. ......................... 29/610 |
| 4,361,599 | 11/1982 | Wourms ...................................... 427/90 |
| 4,491,857 | 1/1985 | McElroy ................................... 357/23 |
| 4,545,111 | 10/1985 | Johnson ..................................... 29/574 |
| 4,562,639 | 1/1986 | McElroy ..................................... 29/584 |
| 4,597,162 | 7/1986 | Johnson et al. ............................ 29/574 |
| 4,651,409 | 3/1987 | Ellsworth et al. ......................... 29/576 |
| 4,748,490 | 5/1988 | Hollingsworth .......................... 357/51 |
| 4,796,075 | 1/1989 | Whitten .................................... 357/51 |

(List continued on next page.)

FOREIGN PATENT DOCUMENTS

| 0 414 361 | 2/1991 | European Pat. Off. ......... H01L 23/52 |
| 0 416 903 | 3/1991 | European Pat. Off. ..... H01L 21/3205 |
| 0 452 091 | 10/1991 | European Pat. Off. ...... H01L 23/525 |
| 0 455 414 | 11/1991 | European Pat. Off. ...... H01L 23/525 |
| 0 457 463 | 11/1991 | European Pat. Off. ...... H01L 23/525 |
| 0 489 570 | 6/1992 | European Pat. Off. ......... G11C 17/18 |
| 0 493 957 | 7/1992 | European Pat. Off. ......... G11C 17/16 |
| 0 500 034 | 8/1992 | European Pat. Off. ...... H01L 23/525 |
| 0 501 120 | 9/1992 | European Pat. Off. ...... H01L 23/525 |
| 0 528 417 | 2/1993 | European Pat. Off. ......... G11C 17/16 |
| 0 539 197 | 4/1993 | European Pat. Off. ...... H01L 23/525 |
| 4,814,853 | 3/1989 | Uchida ....................................... 357/51 |
| 4,822,753 | 4/1989 | Pintchovski et al. .................... 437/192 |
| 4,847,732 | 7/1989 | Stopper et al. ......................... 361/395 |

(List continued on next page.)

OTHER PUBLICATIONS

Gordon, et al., "Conducting Filament of the Programmed Metal Electrode Amorphous Silicon Antifuse", 1993 IEEE, IEDM 93, pp. 27–30.

"Xilinx Reveals Sea–of–Gates FPGA Plans", E.E. Times.

*Primary Examiner*—Valencia Martin-Wallace
*Attorney, Agent, or Firm*—D'Alessandro & Ritchie

[57] ABSTRACT

A metal-to-metal antifuse disposed between two aluminum metallization layers in a CMOS integrated circuit or similar structure includes an antifuse material layer having a substantially aluminum-free conductive link. The substantially aluminum-free link is formed by forming a first barrier metal layer out of TiN having a first thickness, a second barrier metal layer out of TiN having a second thickness which may be less than said first thickness, the first and second barrier metal layers separating the antifuse material layer from first and second electrodes. The antifuse is programmed by applying a voltage potential capable of programming the antifuse across the electrodes with the more positive side of the potential applied to the electrode adjacent the barrier metal layer having the least thickness. In another aspect of the invention, an antifuse having a first barrier metal layer of a first thickness and a second barrier metal layer of a second thickness may be fabricated wherein the first thickness is less than the second thickness and wherein programming of the antifuse is accomplished by placing the more positive voltage of the programming voltage supply on the electrode of the antifuse adjacent the first barrier metal layer.

18 Claims, 5 Drawing Sheets

U.S. PATENT DOCUMENTS

| | | | |
|---|---|---|---|
| 4,874,711 | 10/1989 | Hughes et al. | 437/8 |
| 4,899,205 | 2/1990 | Hamdy et al. | 357/51 |
| 4,914,055 | 4/1990 | Gordon et al. | 437/192 |
| 4,943,538 | 7/1990 | Mohsen et al. | 437/52 |
| 5,008,855 | 4/1991 | Eltoukhy et al. | 365/96 |
| 5,070,384 | 12/1991 | McCollum et al. | 357/51 |
| 5,093,711 | 3/1992 | Hirakawa | 357/71 |
| 5,095,362 | 3/1992 | Roesner | 357/23.4 |
| 5,100,827 | 3/1992 | Lytle | 437/52 |
| 5,126,282 | 6/1992 | Chiang et al. | 437/172 |
| 5,130,777 | 7/1992 | Galbraith et al. | 357/51 |
| 5,134,457 | 7/1992 | Hamdy et al. | 357/51 |
| 5,166,556 | 11/1992 | Hsu et al. | 307/465 |
| 5,171,715 | 12/1992 | Husher et al. | 437/195 |
| 5,194,759 | 3/1993 | El-Ayat et al. | 307/202.1 |
| 5,196,724 | 3/1993 | Gordon et al. | 257/530 |
| 5,200,920 | 4/1993 | Norman et al. | 365/185 |
| 5,233,206 | 8/1993 | Lee et al. | 257/50 |
| 5,233,217 | 8/1993 | Dixit et al. | 257/530 |
| 5,237,219 | 8/1993 | Cliff | 307/465 |
| 5,241,496 | 8/1993 | Lowrey et al. | 365/96 |
| 5,242,851 | 9/1993 | Choi | 437/49 |
| 5,243,226 | 9/1993 | Chan | 307/465 |
| 5,248,632 | 9/1993 | Tung et al. | 437/195 |
| 5,257,222 | 10/1993 | Lee | 365/96 |
| 5,257,225 | 10/1993 | Lee | 365/185 |
| 5,266,829 | 11/1993 | Hamdy et al. | 257/530 |
| 5,270,251 | 12/1993 | Cohen | 437/173 |
| 5,272,101 | 12/1993 | Forouhi et al. | 437/50 |
| 5,272,388 | 12/1993 | Bakker | 307/202.1 |
| 5,272,666 | 12/1993 | Tsang et al. | 365/96 |
| 5,284,788 | 2/1994 | Spratt et al. | 437/52 |
| 5,286,993 | 2/1994 | Lowery et al. | 257/390 |
| 5,290,734 | 3/1994 | Boardman et al. | 437/195 |
| 5,293,133 | 3/1994 | Birkner et al. | 324/713 |
| 5,294,846 | 3/1994 | Paivinen | 307/465 |
| 5,298,784 | 3/1994 | Gambino et al. | 257/529 |
| 5,299,151 | 3/1994 | Ishihara et al. | 364/65 |
| 5,300,456 | 4/1994 | Tigelaar et al. | 437/195 |
| 5,302,546 | 4/1994 | Gordon et al. | 257/530 |
| 5,304,508 | 4/1994 | Cohen | 437/170 |
| 5,308,795 | 5/1994 | Hawley et al. | 437/195 |
| 5,314,840 | 5/1994 | Schepis et al. | 437/194 |
| 5,316,971 | 5/1994 | Chiang et al. | 437/170 |
| 5,322,812 | 6/1994 | Dixit et al. | 437/60 |
| 5,327,024 | 7/1994 | Cox | 307/465 |
| 5,329,153 | 7/1994 | Dixit | 257/530 |
| 5,341,043 | 8/1994 | McCollum | 307/465 |
| 5,353,246 | 10/1994 | Tsang et al. | 365/96 |
| 5,371,414 | 12/1994 | Galbraith | 327/525 |
| 5,387,311 | 2/1995 | Hall et al. | 156/630 |
| 5,390,141 | 2/1995 | Cohen et al. | 365/96 |
| 5,391,513 | 2/1995 | Delgado et al. | 437/60 |
| 5,391,518 | 2/1995 | Bhushan | 437/190 |
| 5,395,797 | 3/1995 | Chen et al. | 437/195 |
| 5,397,939 | 3/1995 | Gordon et al. | 326/38 |
| 5,403,778 | 4/1995 | Kwok et al. | 437/188 |
| 5,404,029 | 4/1995 | Husher et al. | 257/50 |
| 5,412,245 | 5/1995 | Favreau | 257/530 |
| 5,414,364 | 5/1995 | McCollum | 324/550 |
| 5,416,355 | 5/1995 | Kudoh | 257/529 |
| 5,444,290 | 8/1995 | Paz De Araujo et al. | 257/530 |
| 5,448,184 | 9/1995 | Paivinen | 326/38 |
| 5,448,187 | 9/1995 | Kowalski | 326/81 |
| 5,449,947 | 9/1995 | Chen et al. | 257/530 |
| 5,469,077 | 11/1995 | Cox | 326/38 |
| 5,469,109 | 11/1995 | Paivinen | 327/525 |
| 5,469,379 | 11/1995 | Levy | 365/96 |
| 5,471,154 | 11/1995 | Gordon et al. | 326/38 |
| 5,477,167 | 12/1995 | Chua | 326/41 |
| 5,482,884 | 1/1996 | McCollum et al. | 437/60 |
| 5,485,031 | 1/1996 | Zhang et al. | 257/530 |
| 5,485,032 | 1/1996 | Schepis et al. | 257/530 |
| 5,485,105 | 1/1996 | Harward et al. | 326/38 |
| 5,495,181 | 2/1996 | Kolze | 326/38 |
| 5,495,436 | 2/1996 | Callahan | 365/96 |
| 5,502,395 | 3/1996 | Allen | 324/713 |
| 5,514,980 | 5/1996 | Pilling et al. | 326/38 |
| 5,525,909 | 6/1996 | McCollum | 324/550 |
| 5,541,441 | 7/1996 | Yeuochung et al. | 257/530 |
| 5,544,070 | 8/1996 | Cox et al. | 364/489 |
| 5,550,400 | 8/1996 | Takagi et al. | 257/530 |
| 5,552,743 | 9/1996 | Manning | 327/567 |
| 5,557,136 | 9/1996 | Gordon et al. | 257/530 |
| 5,572,458 | 11/1996 | Smith et al. | 365/96 |
| 5,600,262 | 2/1997 | Kolze | 326/38 |
| 5,614,756 | 3/1997 | Forouhi et al. | 257/530 |
| 5,631,862 | 5/1997 | Cutter et al. | 365/96 |
| 5,635,854 | 6/1997 | Shimanek et al. | 326/38 |
| 5,641,985 | 6/1997 | Tamura et al. | 257/530 |
| 5,658,819 | 8/1997 | Humphrey et al. | 438/600 |
| 5,661,412 | 8/1997 | Chawla et al. | 326/38 |
| 5,663,091 | 9/1997 | Yen et al. | 437/60 |
| 5,663,591 | 9/1997 | Iranmanesh | 257/530 |
| 5,668,751 | 9/1997 | Sher et al. | 365/96 |
| 5,670,403 | 9/1997 | Chen | 437/52 |
| 5,670,818 | 9/1997 | Forouhi et al. | 257/530 |
| 5,679,974 | 10/1997 | Shinriki et al. | 257/530 |
| 5,682,058 | 10/1997 | Iranmanesh | 257/530 |
| 5,684,732 | 11/1997 | Sako | 365/96 |
| 5,687,116 | 11/1997 | Kowshik et al. | 365/185.03 |
| 5,689,455 | 11/1997 | Mullarkey et al. | 365/96 |
| 5,705,849 | 1/1998 | Zheng et al. | 257/530 |
| 5,726,484 | 3/1998 | Hart et al. | 257/530 |

FOREIGN PATENT DOCUMENTS

| | | | |
|---|---|---|---|
| 0 603 105 | 6/1994 | European Pat. Off. | H01L 23/525 |
| 0 626 726 | 11/1994 | European Pat. Off. | H01L 23/525 |
| 0 660 408 | 6/1995 | European Pat. Off. | H01L 23/525 |
| 0 661 745 | 7/1995 | European Pat. Off. | H01L 23/525 |
| 0 755 017 | 1/1997 | European Pat. Off. | G06F 17/50 |
| 2 367 352 | 5/1978 | France | H01L 27/06 |
| 5-343633 | 3/1994 | Japan | H01L 27/10 |
| 6-085068 | 3/1994 | Japan | H01L 21/82 |
| 6-505368 | 6/1994 | Japan | H01L 21/82 |
| 6-196567 | 7/1994 | Japan | H01L 21/90 |
| 6-204341 | 7/1994 | Japan | H01L 21/82 |
| 6-216061 | 8/1994 | Japan | H01L 21/28 |
| 6-216254 | 8/1994 | Japan | H01L 21/82 |
| 6-224303 | 8/1994 | Japan | H01L 21/82 |
| 6-268071 | 9/1994 | Japan | H01L 21/82 |
| 6-302700 | 10/1994 | Japan | H01L 21/82 |
| 6-302701 | 10/1994 | Japan | H01L 21/82 |
| 6-509442 | 10/1994 | Japan | H01L 21/82 |
| 6-310604 | 11/1994 | Japan | H01L 21/82 |
| 6-310687 | 11/1994 | Japan | H01L 27/118 |
| 6-318864 | 11/1994 | Japan | H03K 19/173 |
| 6-510634 | 11/1994 | Japan | H01L 21/82 |
| 6-511352 | 12/1994 | Japan | H01L 21/82 |
| 7-022513 | 1/1995 | Japan | H01L 21/82 |
| 7-045792 | 2/1995 | Japan | H01L 27/10 |
| 7-066199 | 3/1995 | Japan | H01L 21/3205 |
| 7-099248 | 4/1995 | Japan | H01L 21/82 |
| 7-142585 | 6/1995 | Japan | H01L 21/82 |
| 7-176772 | 7/1995 | Japan | H01L 29/88 |
| 7-183386 | 7/1995 | Japan | H01L 21/82 |
| 7-211873 | 8/1995 | Japan | H01L 27/10 |
| 7-226435 | 8/1995 | Japan | H01L 21/768 |
| 7-263562 | 10/1995 | Japan | H01L 21/82 |
| 7-273202 | 10/1995 | Japan | H01L 21/82 |
| 7-321287 | 12/1995 | Japan | H01L 27/04 |
| 7-326675 | 12/1995 | Japan | H01L 21/82 |

| | | | | |
|---|---|---|---|---|
| 8-017931 | 1/1996 | Japan | H01L | 21/82 |
| 8-051157 | 2/1996 | Japan | H01L | 21/82 |
| 8-078532 | 3/1996 | Japan | H01L | 21/82 |
| 2 222 024 | 2/1990 | United Kingdom | H01L | 21/82 |
| 87/00969 | 2/1987 | WIPO | H01L | 23/52 |
| 87/02827 | 5/1987 | WIPO | H01L | 27/24 |
| 92/13359 | 8/1992 | WIPO | H01L | 21/285 |
| 92/20109 | 11/1992 | WIPO | H01L | 45/00 |
| 93/03497 | 2/1993 | WIPO | H01L | 21/70 |
| 93/03499 | 2/1993 | WIPO | H01L | 23/525 |
| 93/04499 | 3/1993 | WIPO | H01L | 21/70 |
| 93/05514 | 3/1993 | WIPO | G11C | 17/16 |
| 94/05086 | 3/1994 | WIPO | H03K | 19/173 |
| 96/38861 | 12/1996 | WIPO | H01L | 23/525 |
| 96/39717 | 12/1996 | WIPO | H01L | 23/525 |

METAL-TO-METAL VIA-TYPE ANTIFUSE

CROSS-REFERENCE TO RELATED APPLICATION

This is a divisional of patent application Ser. No. 08/538,962, filed Oct. 4, 1995, U.S. Pat. No. 5,741,720.

BACKGROUND OF THE INVENTION

1. Field of the Invention

This invention relates generally to the field of metal-to-metal antifuses which are used in integrated circuit devices to form selectively programmable conductive links between metallization layers of the integrated circuit devices. More particularly, this invention relates to improved antifuses and methods for programming such antifuses which yield, after programming, an antifuse link disposed through the antifuse material layer which does not include any significant quantities of aluminum metal and which is, therefore, more reliable and of more predictable resistance.

2. The Prior Art

Antifuses and metal-to-metal antifuses are well known in the art. A problem exists, however, which affects the useful life of devices incorporating metal-to-metal antifuses. Most metal-to-metal antifuses exist between two aluminum metal film metallization layers in an integrated circuit device such as a CMOS-type device. When a voltage of sufficient magnitude is applied between the metallization layers in the vicinity of the antifuse, the antifuse material layer and a portion of the adjacent metallization layers will disrupt and/or melt or vaporize and a conductive link will form through the antifuse material layer due to metal from the adjacent metallization layer being drawn in and intermixed through mass transport and thermal driven material diffusion and chemical reaction, effectively shorting the two metallization layers together at the location of the antifuse. The conductive link is primarily formed of the material in the adjacent metallization layer in the immediate vicinity of the disruption.

Unfortunately, in many cases it has been noticed that under certain types of stress such conductive links will open up or become non-conductive. This failure mode often manifests itself after a period of time during which the antifuse links appear to have been properly formed. This failure mode is commonly known as "read disturb" because the small currents used to read the state of the antifuse—much smaller than the typical current used to program the antifuse—eventually cause a state reversal in the programmed antifuse. Such a failure can destroy not only the particular link that fails, but the entire device in which the antifuse is located and, potentially, the equipment in which the device is placed. This problem has substantially retarded the commercial acceptance and development of metal-to-metal antifuses.

One factor that is now believed to contribute to read disturb is the presence of any significant quantity of aluminum in the antifuse conductive links. Aluminum is well known to be subject to electromigration, i.e., in the presence of an electron current flow, the aluminum metal atoms tend to move along with the electron current flow (opposite to the direction of normal positive to ground electric current flow). Accordingly, researchers in the prior art have attempted to block aluminum flow into the antifuse material layer with barrier layers of various materials and various thicknesses. The barrier metals, in turn, have to take the place of the aluminum, and provide essentially the entirety of the conductive material which flows into the antifuse material layer to form the conductive links that short the two metallization layers together.

During the programming of the antifuse, the resistance between the two metallization layers of the antifuse goes from a few gigaohms to less than 100 ohms—a change of over seven orders of magnitude. A relatively large amount of heat is also released during this process. This heat, if near enough to the aluminum metallization layer, can melt or vaporize it, making it easy for aluminum to flow into the antifuse material layer to undesirably participate in the formation of conductive links.

One prior art method for forming antifuses is illustrated in FIG. 1. According to this method, an antifuse aperture or via 10 is formed between two metallization layers 12, 14 separated by a dielectric material 16 such as $SiO_2$ ("interlayer dielectric layer"). In this type of structure, the lower antifuse electrode 18 is formed of an aluminum metallization layer 12 covered by a barrier metal layer 20; the upper antifuse electrode 22 is formed of aluminum metallization layer 14 disposed over barrier metal layer 24. Antifuse material layer 26 is deposited into the antifuse aperture 10 with any of a number of techniques and may comprise any of a number of materials including multiple layers of different materials, and is subject to step coverage problems which occur whenever a material is deposited into an aperture, namely, a thinning of the deposited layers at the edges or corners of the aperture 28, 30 relative to the thickness of the layer at the center 32 of the aperture 10. This thinning of both antifuse material layer 26 and barrier metal layer 24 tends to force the antifuse to "blow" or "program" in one of the corners 28, 30 at a somewhat unpredictable voltage and can lead to aluminum from metallization layer 14 breaching the thinned barrier metal layer 24 to enter antifuse material layer 26 during the programming of the antifuse and thereby contaminate the conductive link with aluminum metal.

A similar antifuse structure, known as the "half-stack", is shown in FIG. 2. The FIG. 2 antifuse 34 comprises a lower electrode 36 formed of an aluminum metallization layer 38 overlaid by a layer of a barrier metal 40. Over the barrier metal layer 40 is disposed an antifuse material layer 42 which may be of a multi-layer multi-material construction or other construction as is well known in the art. Over the antifuse material layer 42 is an antifuse via 44 through interlayer dielectric layer 52 into which is deposited upper electrode 46 which consists of barrier metal layer 48 and aluminum metallization layer 50. An interlayer dielectric layer 52 is disposed between the electrodes 36, 46. Such an antifuse may be programmed as follows: provide a first voltage pulse across electrodes 36, 46 with the less positive voltage tied to electrode 46 and the more positive voltage tied to electrode 36, the difference between the less positive and more positive voltages being a potential sufficient to program the antifuse, followed by a series of other voltage pulses, known as an "ac soak" (See, e.g., U.S. patent application Ser. No. 08/110,681 filed Aug. 23, 1993 in the name of Steve S. Chiang, et al., entitled "Methods For Programming Antifuses Having at Least One Metal Electrode", which is hereby incorporated herein by reference), to aid in the formation of the conductive link. This approach of applying the more positive (greater) voltage first to the bottom electrode is known as "VOB" or voltage on bottom. The converse arrangement is known as "VOT" or voltage on top. A method often used in programming antifuses is to apply a series of programming pulses having an amplitude in one direction greater than the amplitude in the other direction, e.g., +10 volt pulse followed by −8 volt pulse. In this way, the greater stress is applied during the +10 volt pulse, thus the antifuse is more likely to program during the +10 volt pulse. If it fails to program on the first pulse, it probably won't program on the −8 volt pulse and will likely program on a subsequent +10 volt pulse. In this way it can be assured that the antifuse will only disrupt while the current is flowing in one particular and predetermined direction.

As used herein, the terms VOT and VOB refer to either a pure DC programming voltage, or more commonly, to the first pulse, or to the pulse having the greater magnitude when it is not the first pulse. Thus VOT and VOB refer to the conditions during actual initial formation of the conductive link.

When a series of half-stack antifuses having upper barrier layers of TiN of minimum thickness of less than about 2000 Å were programmed in this fashion, VOB, the results shown in FIG. 3 were obtained FIG. 3 is a histogram plot showing the resulting resistance of the programmed antifuse along the horizontal axis against the number of antifuses having that resistance along the vertical axis. As can be seen, the grouping is not very tight with an average of 21 ohms, an outlier at nearly 100 ohms and a standard deviation of 3.1. Aluminum content in the conductive links is believed responsible for this relatively poor performance.

FIG. 9A and FIG. 9B are renditions of scanning electron micrographs of sectioned, programmed antifuses. In FIGS. 9A and FIGS. 9B, antifuses comprising upper aluminum metal layer A, barrier layer B, antifuse layer C, lower barrier layer D and lower aluminum metal layer E are shown. The antifuse of FIG. 9A was programmed VOT resulting in visible disruption/mixing of layers D and C but no visible effects to layer B. In this case, a more positive voltage applied to the top electrode (A/B) produces a downward electric current and an upward electron current. The result is a conductive filament shorting layers B and D. If the disruption (shown at "X") of layer D is sufficient to extend all of the way through layer D (which it can be seen that it does not do here), aluminum in layer E will also likely be disrupted/intermixed and the potential for inclusion of aluminum in the conductive filament is substantially increased. In FIG. 9B the antifuse was programmed VOB and the opposite results obtain. Layer D is apparently entirely unscathed, but layers B and C are disrupted. Because such via-type antifuses have well known step coverage problems, the thickness of layer B is thinner in the corners of the antifuse aperture, hence the antifuse tends to program in the corners due to less overall electrical resistance in these locations. As can be seen, layer B is significantly eroded to the point of almost complete penetration where the antifuse programmed.

U.S. Pat. No. 5,302,546 to Gordon, et al., describes a possible solution to this problem. In FIG. 1 of Gordon, et al., reproduced here as FIG. 4, an antifuse 54 is shown which incorporates non-conductive spacers 56, 58 disposed in the corners 60, 62, respectively, of the antifuse aperture 64. These spacers 56, 58 force the conductive metal electrode 66 formed of barrier metal 68 and aluminum metallization layer 70 away from the corners 60, 62 so that it is disposed immediately above only the thickest part 72 of the antifuse material layer 74. Antifuse 54 is constructed over a lower electrode 78 which is disposed over dielectric layer 80 which is in turn disposed over substrate 82. Interlayer dielectric layer 84 separates electrodes 66 and 78. An important drawback to this solution is that formation of spacers 56, 58 requires additional process steps which increase costs. Gordon, et al. further teach using a VOT programming scheme with their antifuse, however, they do not suggest why this is to be preferred to a VOB scheme, nor do they teach any utility in providing differential barrier metal layer thicknesses in conjunction with such a scheme or a realization that the spacers 56, 58 may be obviated by choice of materials and programming technique.

Accordingly, it would be extremely desirable to formulate a design for a metal-to-metal via-type antifuse which is not susceptible to conductive link failure or "read-disturb" as a solution to this problem would open the door to wide commercial acceptance of metal-to-metal antifuses.

SUMMARY OF THE INVENTION

The present invention solves the problem of conductive link failure in metal-to-metal via-type antifuses. The solution is essentially independent of antifuse configuration. According to a first aspect of the invention, for antifuses including an upper barrier metal layer disposed in an antifuse via directly over an antifuse material layer, either in, or below the via, the solution is to form the lower barrier metal layer below the via thicker than the upper barrier metal layer in the via and to provide for programming the antifuse VOT so as to drive electrons upward through the thinner upper barrier metal layer and into the overlying aluminum layer during programming. This results in the creation of an essentially aluminum free conductive link (preferably less than 1% aluminum content in the link itself). It is highly preferred to use Titanium Nitride (TiN) as the barrier metal because of its low thermal conductivity which holds heat in a small region around the rupture caused by blowing the antifuse thus allowing a minimum of electrical energy to be used (and deposited in the antifuse) and because of its high resistance to aluminum diffusion through it which further minimizes the likelihood of disrupting/intermixing aluminum and preventing aluminum from diffusing through the TiN which could then form a part of the conductive link of the programmed antifuse.

According to a second aspect of the invention, an antifuse having a first barrier metal layer of a first minimum thickness and a second barrier metal layer of a second minimum thickness may be fabricated wherein the first minimum thickness is less than the second minimum thickness and wherein programming of the antifuse is accomplished by placing the more positive voltage of the programming voltage supply on the electrode of the antifuse adjacent the first (thinner) barrier metal layer.

According to a third aspect of the present invention, it is possible to fabricate reliable antifuses having upper and lower TiN barrier metal layers surrounding an antifuse material layer and adjacent to aluminum metallization layers with one barrier metal layer thinner than the other, and having a minimum thickness of as little as 1000 Å by applying the programming signal as follows: (I) where the upper barrier layer has a minimum thickness in the range of 1000 Å–2000 Å and the lower barrier layer has a minimum thickness in the range of 2000 Å or more, using VOT programming to take advantage of the thicker lower barrier layer to protect the antifuse filament from aluminum incursion and (II) where the upper barrier layer has a minimum thickness in the range of 2000 Å or more and the lower barrier layer has a minimum thickness in the range of 1000 Å–2000 Å, using VOB programming to take advantage of the thicker upper barrier layer to protect the antifuse filament from aluminum incursion.

According to a fourth aspect of the present invention, it is possible to fabricate reliable antifuses having upper and lower TiN barrier metal layers both exceeding 2000 Å in minimum thickness surrounding an antifuse material layer and adjacent to aluminum metallization layers with by applying the programming signal as follows: using either VOT or VOB programming as the thick barrier layers will protect the antifuse filament from aluminum incursion.

OBJECTS AND ADVANTAGES OF THE INVENTION

Accordingly, it is an object of the present invention to provide metal-to-metal via-type antifuses which are not subject to conductive link failure.

It is a further object of the present invention to provide a programmed antifuse structure having a conductive link formed therein lacking any significant amount of aluminum metal.

It is a further object of the present invention to provide improved metal-to-metal via-type antifuse structures.

Yet a further object of the present invention is to provide improved programming methods for use with metal-to-metal via-type antifuse structures which result in programmed antifuses having increased life and reliability.

These and many other objects and advantages of the present invention will become apparent to those of ordinary skill in the art from a consideration of the drawings and ensuing description of the invention.

BRIEF DESCRIPTION OF THE DRAWINGS AND PHOTOGRAPHS

DESCRIPTION OF THE PREFERRED EMBODIMENTS

Those of ordinary skill in the art will realize that the following description of the present invention is illustrative only and is not intended to be in any way limiting. Other embodiments of the invention will readily suggest themselves to such skilled persons from an examination of the within disclosure.

The preferred embodiment described herein is for an antifuse having an antifuse aperture of diameter approximately 10000 Å or less and programmable with an applied potential preferably in the range of about 9.5 V to about 12 V at a programming current of about 10–30 mA. Changes in the programming voltage will scale with changes in dimension and antifuse material(s) choice as known to those of ordinary skill in the art.

One of the main purposes for developing metal-to-metal antifuses is so that they may be disposed over an active region of a semiconductor substrate which has transistors formed in it. In this way, the "real estate" taken by the transistors is reused by the antifuses, much the way as a sky scraper is able to reuse the same land with each additional floor thus increasing areal building density. The ability to safely place antifuses over an active region of a semiconductor substrate depends upon the ability of the antifuses to behave in a manner before, during and after programming that does not result in contamination or other damage to the transistors already constructed in the active region.

Figure 5:
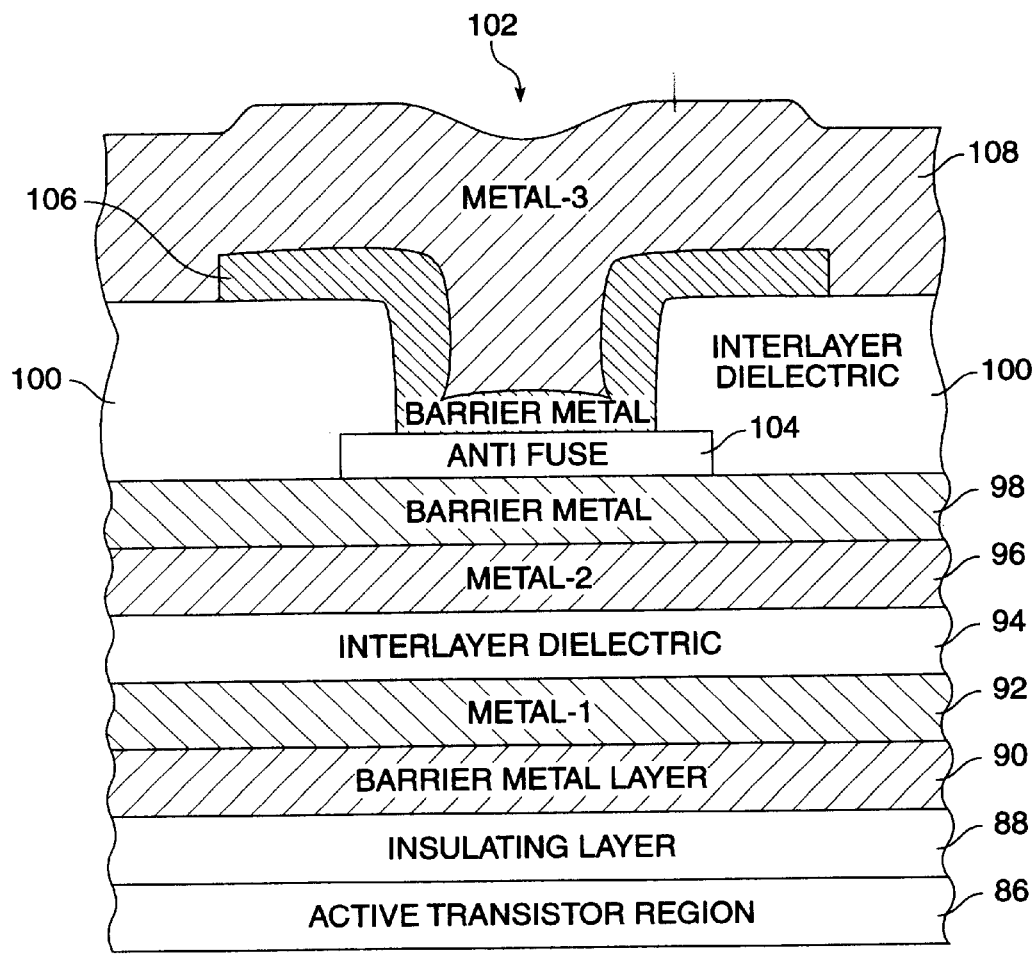
FIG. 5 is a cross sectional diagram of an antifuse structure according to a presently preferred embodiment of the present invention.

It is thus desirable to program the antifuses with a minimum energy so that a minimum heating of the aluminum metallization layer is achieved thus minimizing the likelihood that aluminum will migrate into the active transistor region of the semiconductor substrate as well as into the conductive links of the antifuse itself. According to a presently preferred embodiment of the present invention, the structure of FIG. 5 is capable of meeting these requirements. Referring to FIG. 5, and beginning at the bottom, the layers are: active transistor region 86; insulating layer 88 (thickness range of about 5000–15000 Å with about 7500 Å presently preferred, preferred material(s): $SiO_2$); barrier metal layer 90 (thickness range of about 100–1000 Å with about 500 Å presently preferred, preferred material(s): Ti adhesion layer of thickness about 100–500 Å (preferably about 250 Å) under a TiN barrier layer of thickness about 100–500 Å (preferably about 250 Å)); first metallization layer or "Metal-1" 92 (thickness range of about 5000–15000 Å with about 8000 Å presently preferred), interlayer dielectric 94 (thickness range of about 5000–15000 Å with about 7500 Å presently preferred, preferred material(s): $SiO^2$); second metallization layer or "Metal-2" 96 (thickness range of about 5000–15000 Å with about 8000 Å presently preferred); another barrier metal layer 98 (thickness range of about 1000–4000 Å with about 2000 Å presently preferred); interlayer dielectric 100 (thickness range of about 4000–15000 Å with about 7500 Å presently preferred, preferred material(s): $SiO_2$); antifuse aperture 102 (preferably round in shape with a depth in the range of about 3000–14000 Å with about 6500 Å presently preferred, and a diameter of about 3000–15000 Å with about 10000 Å presently preferred); antifuse material layer 104 (thickness range 300–1500 Å with the following materials/thicknesses choices presently preferred: (1) SiN/amorphous Si/SiN in a thickness ratio of 75 Å:500 Å:75 Å,Å) (2) SiN/amorphous Si in a thickness ratio of 150 Å:500 Å, (3) amorphous silicon of thickness about 1000 Å or (4) SiN of thickness about 300 Å, barrier metal layer 106 (thickness range of about 1000–4000 Å) disposed in antifuse aperture 102; and, finally, third metallization layer of "Metal-3" 108 (thickness range of about 5000–15000 Å, with about 8000 Å presently preferred). In a standard CMOS process, as envisioned here, the three metallization layers 92, 96 and 108 are all fabricated of an aluminum alloy in a conventional and well-known manner.

Figure 6:
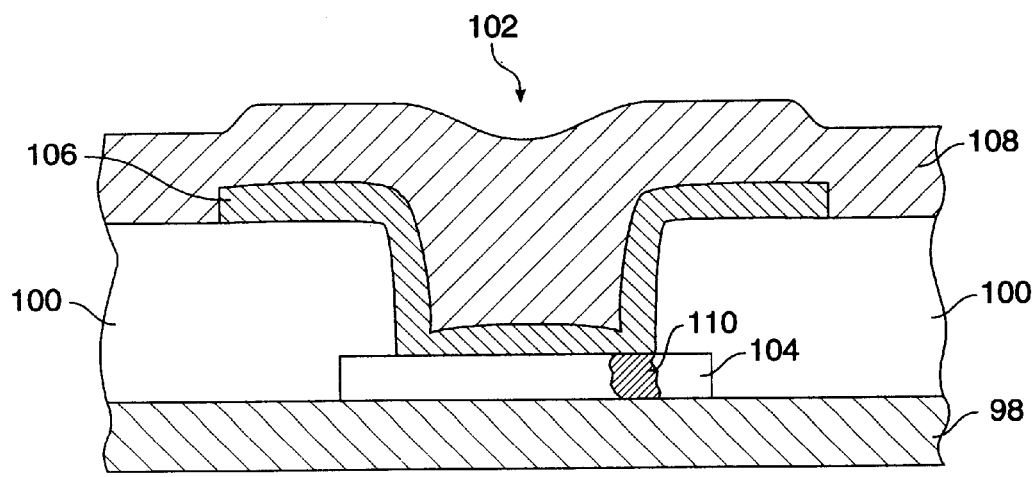
FIG. 6 is an enlargement of a portion of FIG. 5 additionally showing a conductive link formed according to a presently preferred embodiment of the present invention.

FIG. 6 is an enlarged portion of FIG. 5 showing a conductive antifuse link 110 formed in antifuse material layer 104 shorting barrier metal layer 98 to barrier metal layer 106.

Figure 9A:
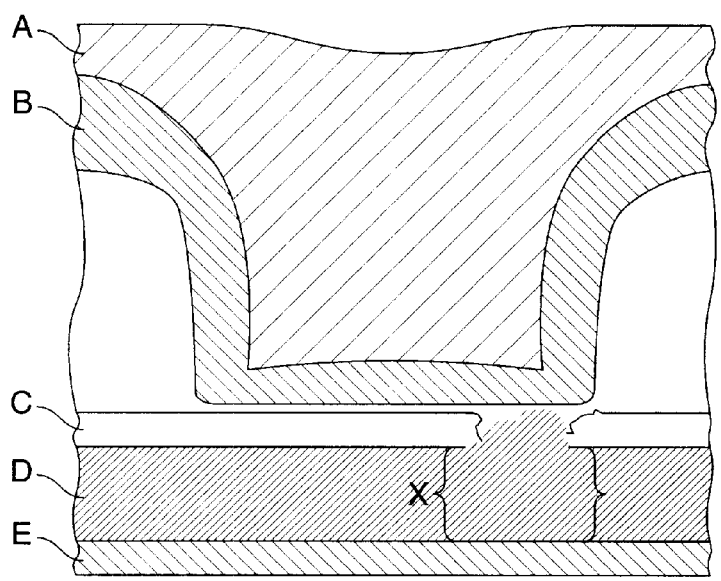
FIG. 9A is a rendition of a scanning electron micrograph of a sectioned, programmed antifuse which was programmed VOT.
Figure 9B:
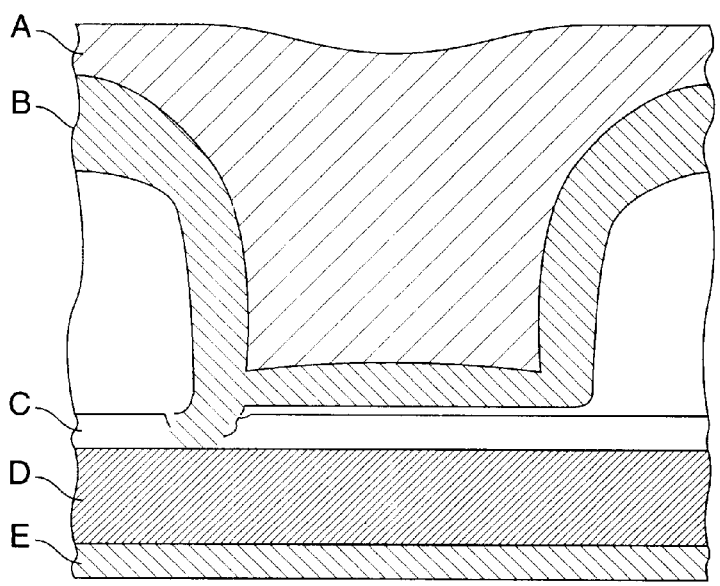
FIG. 9B is a rendition of a scanning electron micrograph of a sectioned, programmed antifuse which was programmed VOB.

According to the present invention, TiN is highly preferred for the barrier metal layers 98 and 106. TiN is a very poor thermal conductor, unlike Titanium Tungsten (TiW) which is often used as a barrier metal. TiN's thermal conductivity is 0.291 $Wcm^{-1}K^{-1}$. Because TiN acts, in essence, as a thermal insulator, it is preferred in this application as follows: when a voltage is applied between Metal-2 and Metal-3 of sufficient magnitude to blow antifuse material layer 104, great amounts of thermal energy will be released as evidenced by FIG. 9A and FIG. 9B discussed above. If barrier metal layers 98 and 106 had a high thermal conductivity, they would rapidly conduct away the heat released in blowing the antifuse 104 with two results: first, it would simply take more energy to disrupt/intermix enough of barrier metal layers 98 and 106 to form the conductive links bridging antifuse material layer 104; and second, this additional energy would be likely to result in melting and/or vaporization of Metal-2 and/or Metal-3, freeing up aluminum so that it can participate in link formation within antifuse material layer 104. This is highly undesirable because, as discussed above, aluminum is subject to electromigration and its presence in any significant quantity (i.e., more than 1%) within these conductive links may result in an unacceptably high probability of read disturb in programmed antifuses and, thus, the failure of the device.

While one might thus seek to coat all antifuses with copious layers of TiN, a practical limitation on the use of TiN in this application is that it is difficult to put an arbitrarily large thickness of TiN within an aperture in a conventional CMOS-type fabrication process. For circular apertures of diameter approximately 1.0 $\mu$m (10000 Å), or less, as presently preferred, it is convenient to deposit a layer of TiN of approximately 1000 Å thickness (at the edge of the aperture which may require that up to about 3000 Å be deposited-due to step coverage-caused thinning at the edges within such an aperture). This thickness at the edge may be stretched to approximately 2000 Å thickness at increased cost and throughput, and significantly thicker films are difficult to achieve with TiN in an aperture using available technology. Accordingly, to take advantage of TiN's desirable properties (good barrier metal and poor thermal conductor), one is practically limited by the available manufacturing processes to a film thickness of 1000 Å–2000 Å at the edge with the thinner film thickness preferred for manufacturability reasons. This desire for thinner films of TiN is in direct conflict with the opposite desire discussed above to deposit as much TiN as possible in the aperture to protect against inadvertent breakthrough of aluminum metal into either the antifuse material layer or, potentially, lower levels of the semiconductor device such as the active transistor region.

Figure 8:
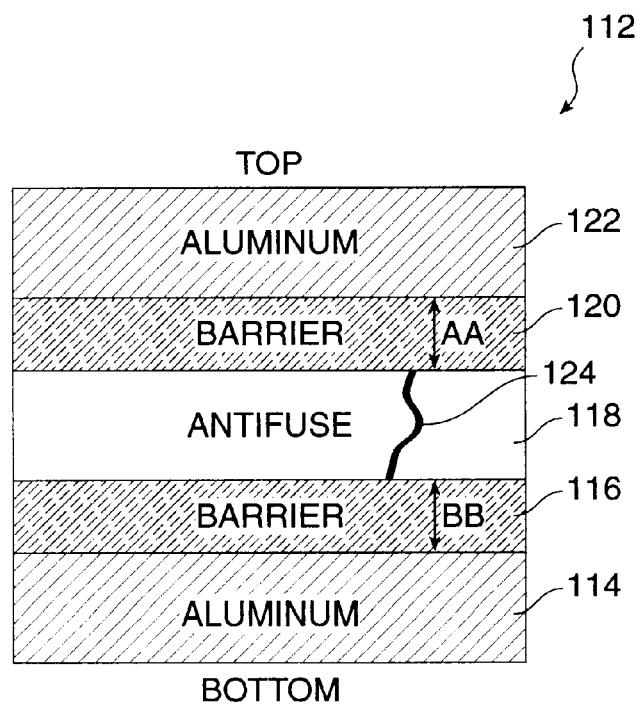
FIG. 8 is a schematic diagram of a typical metal/barrier/antifuse/barrier/metal antifuse structure.

Referring now to FIG. 8, a schematic diagram of an antifuse fabricated according to the present invention is shown. In FIG. 8, the antifuse 112 has a lower aluminum metallization layer 114 covered by a lower TiN barrier layer 116 of minimum thickness BB. Over layer 116 is disposed antifuse material layer(s) 118 which may be of any desired construction including multi-layer multi-material construction as known in the art. Through antifuse material layer 118 is disposed conductive antifuse filament 124 shown schematically as a jagged line. Over antifuse layer 118 is upper TiN barrier layer 120 of minimum thickness AA and over that is upper metallization layer 122 of aluminum.

According to the present invention, it is now possible to fabricate reliable antifuses with one barrier metal layer thinner than the other, and having a thickness of as little as 1000 Å by applying the programming signal as follows: (I) where the upper barrier layer 120 has a minimum thickness AA in the range of 1000 Å–2000 Å and lower barrier layer 116 has a minimum thickness BB in the range of 2000 Å or more, VOT programming as in FIG. 9A will take advantage of the thicker lower barrier layer to protect the antifuse filament 124 from aluminum incursion; (II) where the upper barrier layer 120 has a minimum thickness AA in the range of 2000 Å or more and lower barrier layer 116 has a minimum thickness BB in the range of 1000 Å–2000 Å, VOB programming as in FIG. 9B will take advantage of the thicker upper barrier layer to protect the antifuse filament 124 from aluminum incursion; (III) where the upper barrier layer 120 has a minimum thickness AA of more than about 2000 Å and lower barrier layer 116 has a minimum thickness BB of more than about 2000 Å, either VOT or VOB programming can be used as the thick barrier layers will protect the antifuse filament 124 from aluminum incursion in any event.

This technique assures that the more positive voltage side (as opposed to ground or the less positive voltage side) of the first (or only) pulse is applied to the side of the antifuse having the thinnest layer of TiN barrier metal. In this way, the electron current (opposite the direction of the electric current) flows toward the more positive terminal, thus, the thinner barrier metal at the more positive terminal is not likely to allow the release of aluminum into the antifuse material layer because the electron flow toward the aluminum will cause any flow of aluminum to be away from the antifuse material layer, and since less disruption occurs to the low potential material, the TiN will retain enough material to prevent aluminum diffusion at some later time during chip operational lifetime.

Figure 1:
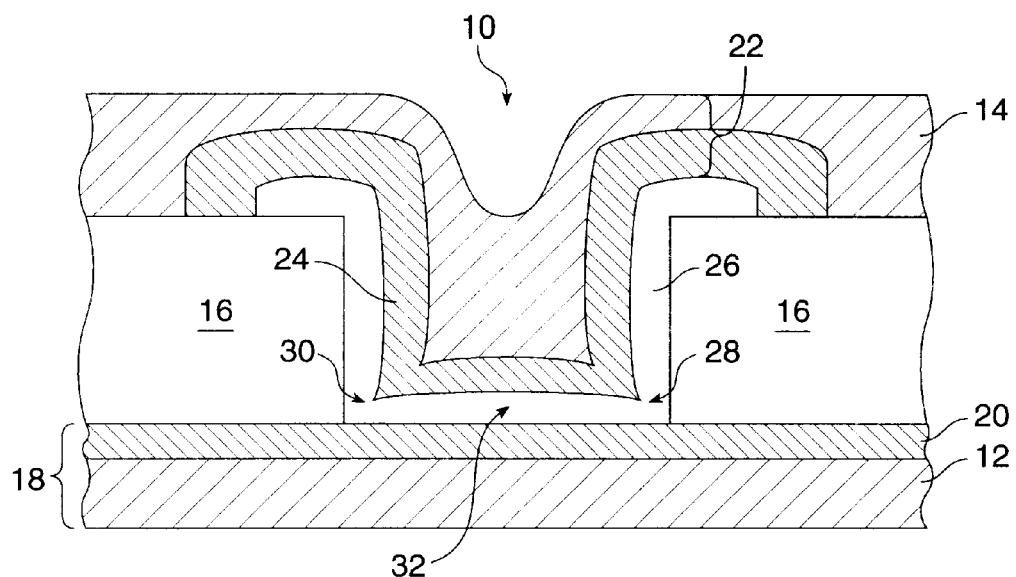
FIG. 1 is a cross sectional diagram of a prior art antifuse.
Figure 2:
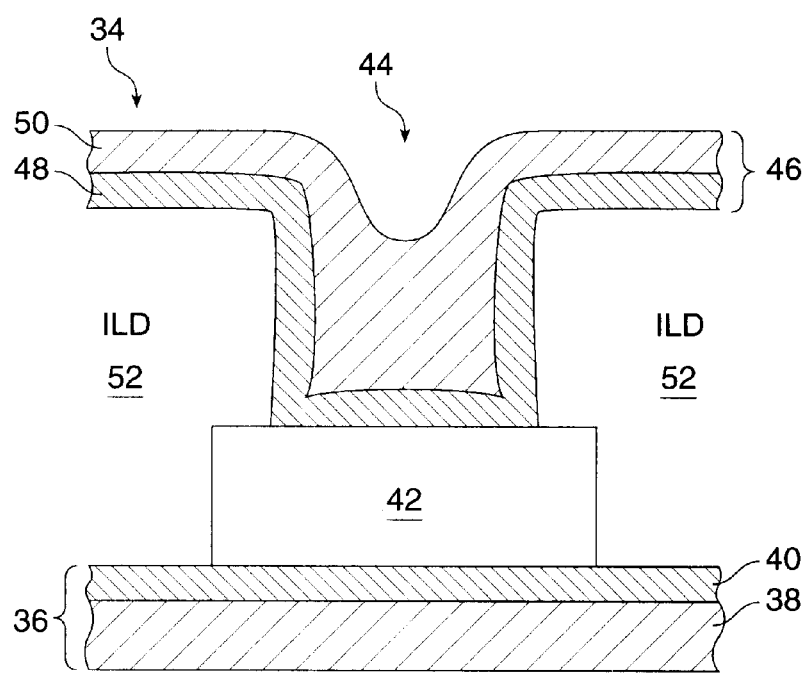
FIG. 2 is a cross sectional diagram of an antifuse.
Figure 3:
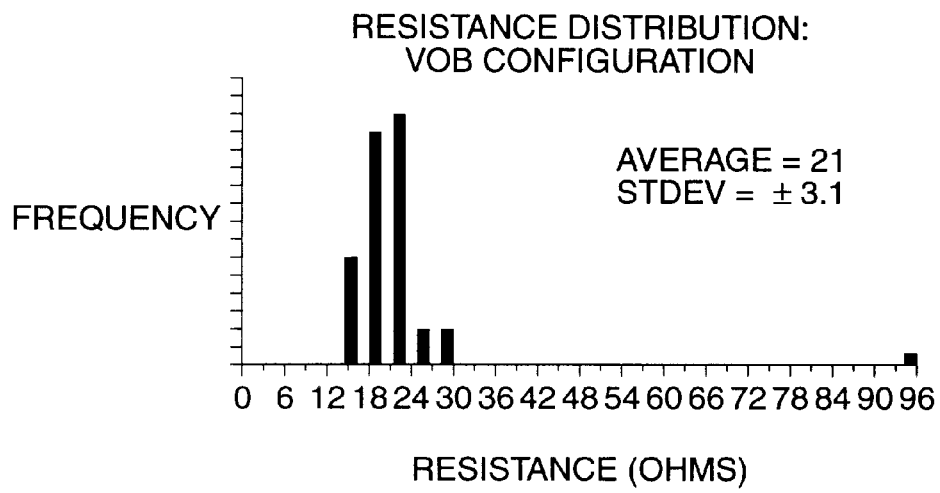
FIG. 3 is a histogram of resistance vs. quantity for a series of tests run with antifuses fabricated according to FIG. 2.
Figure 4:
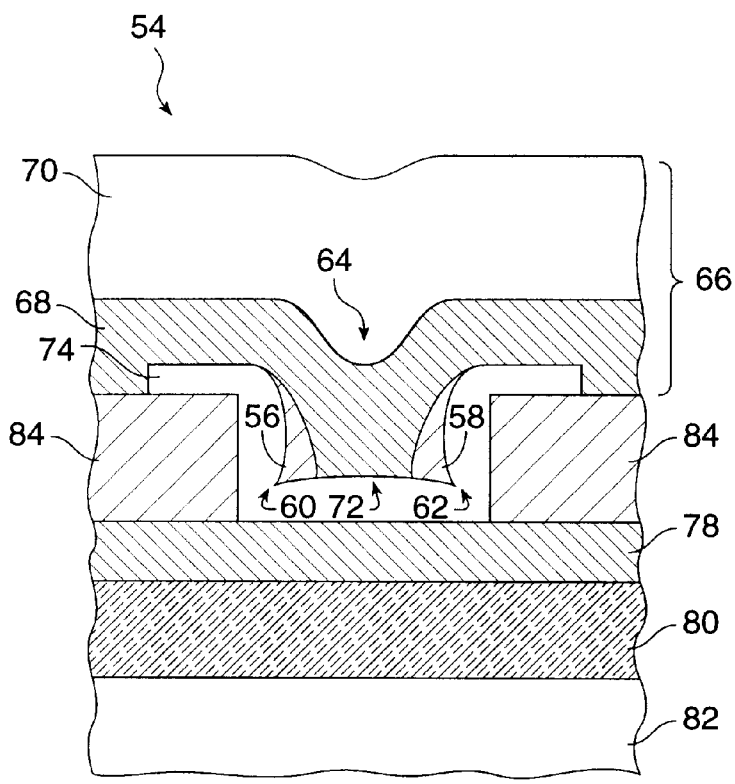
FIG. 4 is a cross sectional diagram of a prior art antifuse.
Figure 7:
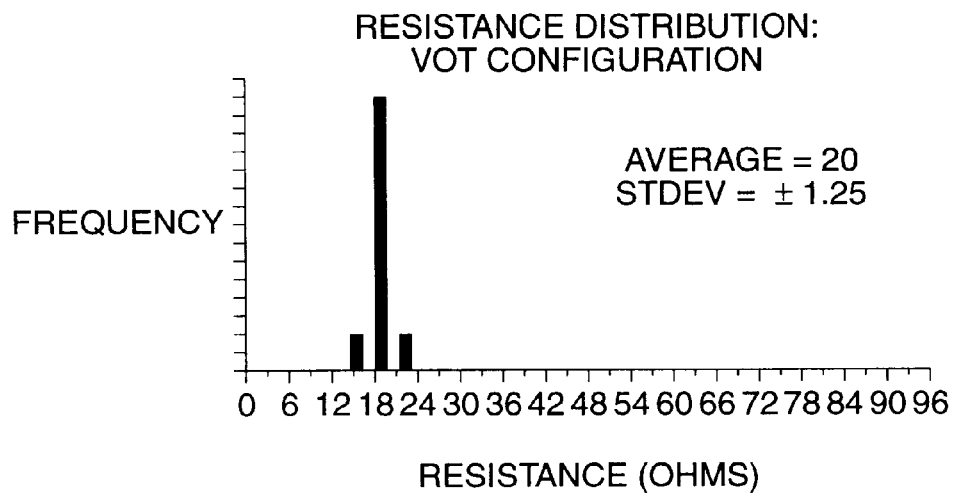
FIG. 7 is a histogram of resistance vs. quantity for a series of tests run with antifuses fabricated according to a presently preferred embodiment of the present invention.

Referring now to FIG. 7, a histogram much like that of FIG. 3 is shown. In this case, the devices were programmed "VOT" rather than "VOB" as in FIG. 3. The result is a much tighter distribution with no outliers, an average programmed antifuse resistance of 20 ohms, and a standard deviation of 1.25. The antifuse design of FIG. 7 incorporated a lower TiN barrier layer having a thickness of 2000 Å or more and an upper TiN barrier layer having a thickness in the range of about 1000 Å–2000 Å.

Accordingly, a large class of antifuse structures have been shown which can be programmed as described to provide substantially aluminum-free conductive links. Such antifuse structures will not suffer from read disturb due to aluminum contamination and will provide stable reliable metal-to-metal antifuses for use in semiconductor devices.

While illustrative embodiments and applications of this invention have been shown and described, it would be apparent to those skilled in the art that many more modifications than have been mentioned above are possible without departing from the inventive concepts set forth herein. The invention, therefore, is not to be limited except in the spirit of the appended claims.

What is claimed is:

1. A programmed antifuse disposed in an integrated circuit comprising:
   a lower conductive layer formed of a film of material including aluminum;
   a lower barrier metal layer disposed over and in electrical contact with said lower conductive layer, said lower barrier metal layer formed of TiN and having a first minimum thickness of greater than 2000 Å;
   an antifuse material layer disposed over and in contact with said lower barrier metal layer;
   an upper barrier metal layer disposed over and in contact with said antifuse material layer, said upper barrier metal layer formed of TiN and having a second minimum thickness, said second minimum thickness being in the range of 1000 Å–2000 Å;

an upper conductive layer formed of a film of material including aluminum, said film disposed over and in electrical contact with said upper barrier metal layer; and a conductive link located within said antifuse material layer and electrically connecting said lower barrier metal layer and said upper barrier metal layer, said conductive link comprising substantially no aluminum metal.

2. A programmed antifuse according to claim 1 wherein said conductive link comprises less than 1% aluminum by weight.

3. A programmed antifuse comprising:

a lower electrode formed of a film of material including aluminum;

a lower barrier metal layer disposed over and in electrical contact with said lower conductive layer, said lower barrier metal layer formed of TiN and having a first minimum thickness in the range of 1000 Å to 2000 Å;

an antifuse material layer disposed over and in contact with said lower barrier metal layer;

an upper barrier metal layer disposed over and in contact with said antifuse material layer, said upper barrier metal layer formed of TiN and having a second minimum thickness, said second minimum thickness being at least 1000 Å and said first minimum thickness being greater than said second thickness;

an upper electrode formed of a film of material including aluminum, said film disposed over and in electrical contact with said upper barrier metal layer; and a conductive link located within said antifuse material layer and electrically connecting said lower barrier metal layer and said upper barrier metal layer, said conductive link comprising substantially no aluminum metal.

4. A programmed antifuse according to claim 3 wherein said conductive link comprises less than 1% aluminum by weight.

5. An antifuse comprising:

a lower conductive layer formed of a film of material including aluminum;

a lower barrier metal layer disposed over and in electrical contact with said lower conductive layer, said lower barrier metal layer formed of TiN and having a first minimum thickness of greater than 2000 Å;

an antifuse material layer disposed over and in contact with said lower barrier metal layer;

an upper barrier metal layer disposed over and in contact with said antifuse material layer, said upper barrier metal layer formed of TiN and having a second minimum thickness, said second minimum thickness being in the range of 1000 Å–2000 Å;

an upper conductive layer formed of a film of material including aluminum, said film disposed over and in electrical contact with said upper barrier metal layer; and programming means for programming the antifuse, said programming means including a power supply capable of applying:

a first programming signal between said lower conductive layer and said upper conductive layer for a first period of time, a voltage induced on said upper conductive layer referenced to said lower conductive layer being positive;

a second programming signal between said lower conductive layer and said upper conductive layer for a second period of time after said first period of time, a voltage induced on said lower conductive layer referenced to said upper conductive layer being negative and the amplitude of said voltage being less than the amplitude of said voltage applied in said first programming signal;

a third programming signal for a third period of time after said second period of time, said third programming signal equivalent to said first programming signal; and a fourth programming signal for a fourth period of time after said third period of time, said fourth programming signal equivalent to said second programming signal.

6. An antifuse comprising:

a lower conductive layer formed of a film of material including aluminum;

a lower barrier metal layer disposed over and in electrical contact with said lower conductive layer, said lower barrier metal layer formed of TiN and having a first minimum thickness in the range of 1000 Å–2000 Å;

an antifuse material layer disposed over and in contact with said lower barrier metal layer;

an upper barrier metal layer disposed over and in contact with said antifuse material layer, said upper barrier metal layer formed of TiN and having a second minimum thickness, said second minimum thickness being greater than 2000 Å;

an upper conductive layer formed of a film of material including aluminum, said film disposed over and in electrical contact with said upper barrier metal layer; and programming means for programming the antifuse, said programming means including a power supply capable of applying:

a first programming signal between said lower conductive layer and said upper conductive layer for a first period of time, a voltage induced on said upper conductive layer referenced to said upper conductive layer being positive;

a second programming signal between said lower conductive layer and said upper conductive layer for a second period of time after said first period of time, a voltage induced on said upper conductive layer referenced to said upper conductive layer being negative and the amplitude of said voltage being less than the amplitude of said voltage applied in said first programming signal;

a third programming signal for a third period of time after said second period of time, said third programming signal equivalent to said first programming signal; and a fourth programming signal for a fourth period of time after said third period of time, said fourth programming signal equivalent to said second programming signal.

7. An antifuse according to claim 1 disposed in a semiconductor device over an active transistor region.

8. An antifuse according to claim 2 disposed in a semiconductor device over an active transistor region.

9. An antifuse according to claim 3 disposed in a semiconductor device over an active transistor region.

10. An antifuse according to claim 4 disposed in a semiconductor device over an active transistor region.

11. An antifuse according to claim 5 disposed in a semiconductor device over an active transistor region.

12. An antifuse according to claim 6 disposed in a semiconductor device over an active transistor region.

13. An unprogrammed antifuse disposed in an integrated circuit comprising:

a lower conductive layer formed of a film of material including aluminum;

a lower barrier metal layer disposed over and in electrical contact with said lower conductive layer, said lower barrier metal layer formed of TiN and having a first minimum thickness of greater than 2000 Å;

an antifuse material layer disposed over and in contact with said lower barrier metal layer;

an upper barrier metal layer disposed over and in contact with said antifuse material layer, said upper barrier metal layer formed of TiN and having a second minimum thickness, said second minimum thickness being in the range of 1000 Å–2000 Å;

an upper conductive layer formed of a film of material including aluminum, said film disposed over and in electrical contact with said upper barrier metal layer; and said unprogrammed antifuse designed to be programmed by applying a programming signal between said lower conductive layer and said upper conductive layer, a voltage induced on said lower conductive layer referenced to said lower conductive layer being positive, such that said programming signal induces metal from said lower barrier metal later and said upper barrier metal later into said antifuse material layer, forming a conductive link between said lower barrier metal layer and said upper barrier metal layer, said conductive link containing substantially no aluminum.

14. An unprogrammed antifuse disposed in an integrated circuit comprising:

a lower conductive layer formed of a film of material including aluminum;

a lower barrier metal layer disposed over and in electrical contact with said lower conductive link, said lower barrier metal layer formed of TiN and having a first minimum thickness in the range of about 1000 Å to about 2000 Å;

an antifuse material layer disposed over and in contact with said lower barrier metal layer;

an upper barrier metal layer disposed over and in contact with said antifuse material layer, said upper barrier metal layer formed of TiN and having a second minimum thickness of greater than 2000 Å; and an upper conductive layer formed of a film of material including aluminum, said film disposed over and in electrical contact with said upper barrier metal layer; and said unprogrammed antifuse designed to be programmed by applying a programming signal between said lower conductive layer and said upper conductive layer, a voltage induced on said lower conductive layer referenced to said upper conductive layer being positive, such that said programming signal induces metal from said lower barrier metal later and said upper barrier metal later into said antifuse material layer, forming a conductive link within said antifuse material layer electrically connecting said lower barrier metal layer and said upper barrier metal layer, said conductive link containing substantially no aluminum.

15. An unprogrammed antifuse disposed in an integrated circuit comprising:

a lower conductive layer formed of a film of material including aluminum;

a lower barrier metal layer disposed over and in electrical contact with said lower conductive layer, said lower barrier metal layer formed of TiN and having a first minimum thickness of at least about 2000 Å;

an antifuse material layer disposed over and in contact with said lower barrier metal layer;

an upper barrier metal layer disposed over and in contact with said antifuse material layer, said upper barrier metal layer formed of TiN and having a second minimum thickness greater than 2000 Å, said second minimum thickness being greater than said first minimum thickness; and an upper conductive layer formed of a film of material including aluminum, said film disposed over and in electrical contact with said upper barrier metal layer; and said unprogrammed antifuse designed to be programmed by applying either (1) a programming signal between said lower conductive layer and said upper conductive layer, a voltage induced on said lower conductive layer referenced to said lower conductive layer being positive, such that said programming signal induces metal from said lower barrier metal later and said upper barrier metal later into said antifuse material layer, forming a conductive link between said lower barrier metal layer and said upper barrier metal layer, said conductive link containing substantially no aluminum, or (2) a programming signal between said lower conductive layer and said upper conductive layer, a voltage induced on said lower conductive layer referenced to said upper conductive layer being positive, such that said programming signal induces metal from said lower barrier metal later and said upper barrier metal later into said antifuse material layer, forming a conductive link within said antifuse material layer electrically connecting said lower barrier metal layer and said upper barrier metal layer, said conductive link containing substantially no aluminum.

16. A programmed antifuse according to claim 5 wherein said conductive link comprises less than 1% aluminum by weight.

17. A programmed antifuse according to claim 6 wherein said conductive link comprises less than 1% aluminum by weight.

18. A programmed antifuse according to claim 11 wherein said conductive link comprises less than 1% aluminum by weight.

* * * * *